(12) United States Patent
Goeke et al.

(10) Patent No.: US 7,906,977 B1
(45) Date of Patent: Mar. 15, 2011

(54) DUAL OUTPUT STAGE SOURCE MEASURE CIRCUIT

(75) Inventors: Wayne C. Goeke, Hudson, OH (US); Martin J. Rice, Sagamore Hills, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 45 days.

(21) Appl. No.: 12/053,878

(22) Filed: Mar. 24, 2008

(51) Int. Cl.
*G01R 27/02* (2006.01)
*G01R 27/08* (2006.01)
(52) U.S. Cl. .......... 324/713; 324/609; 324/691
(58) Field of Classification Search .......... 324/609, 324/691, 713
See application file for complete search history.

(56) References Cited

U.S. PATENT DOCUMENTS

| | | | |
|---|---|---|---|
| 3,624,418 A * | 11/1971 | Kohl et al. ............. | 327/110 |
| 4,535,303 A * | 8/1985 | Schoofs et al. .......... | 330/297 |
| 6,262,670 B1 * | 7/2001 | Ballou ................ | 340/664 |
| 6,911,831 B2 * | 6/2005 | Tsutsui ............... | 324/713 |
| 7,202,676 B2 | 4/2007 | Banaska et al. | |
| 2006/0192571 A1 * | 8/2006 | Banaska et al. ....... | 324/713 |

* cited by examiner

*Primary Examiner* — Timothy J Dole
*Assistant Examiner* — Farhana Hoque
(74) *Attorney, Agent, or Firm* — Pearne & Gordon LLP

(57) ABSTRACT

A circuit for alternatively controlling a current through a device and permitting measurement of a voltage across the device or controlling a voltage across the device and permitting measurement of a current through the device includes a sense impedance in series combination with the device; a buffer communicating with a common point between the sense impedance and the device; a current output stage; and a voltage output stage. When the circuit is controlling the current through the device, the voltage output stage forces the common point to a virtual ground and the current output stage forces a desired current through the device in response to a signal from the buffer. When the circuit is controlling the voltage across the device, the current output stage forces the common point to a virtual ground and the voltage output stage forces a desired voltage across the device in response to the signal from the buffer.

2 Claims, 4 Drawing Sheets

DUAL OUTPUT STAGE SOURCE MEASURE CIRCUIT

BACKGROUND OF THE INVENTION

The present invention relates to electrical measurements and, in particular, to source measure units.

The use of source measure units (SMUs) has become common in many fields, particularly in the testing of semiconductors, integrated circuits and electronic devices.

Referring to FIG. 1, a basic prior art SMU circuit 10 is illustrated. In understanding these circuits it is important to note that the op-amps will do everything in their power to force the difference between their inputs to zero. If S1 is as shown, a voltage corresponding to $V_V$ will be forced across $Z_{Load}$. If S1 is moved to the other position, a current corresponding to $V_I$ will be forced through $Z_{Load}$ (i.e., $V_I/R_{Sense}$ is the current through $R_{Sense}$ and hence through $Z_{Load}$. The unforced parameter, current or voltage with respect to $Z_{Load}$, can then be measured with unshown measuring equipment.

The voltage across $R_{Sense}$ is riding on top of the voltage across $Z_{Load}$. As a result, the amplifier 12 must not only deal with the voltage across its inputs, but also with the offset from $Z_{Load}$. In real-world amplifiers, the common mode errors introduced in translating the voltage from such an offset to ground reference are often the dominate errors in the circuit.

SUMMARY OF THE INVENTION

A circuit for alternatively controlling a current through a device and permitting measurement of a voltage across the device or controlling a voltage across the device and permitting measurement of a current through the device includes a sense impedance in series combination with the device; a buffer communicating with a common point between the sense impedance and the device; a current output stage; and a voltage output stage. When the circuit is controlling the current through the device, the voltage output stage forces the common point to a virtual ground and the current output stage forces a desired current through the device in response to a signal from the buffer. When the circuit is controlling the voltage across the device, the current output stage forces the common point to a virtual ground and the voltage output stage forces a desired voltage across the device in response to the signal from the buffer.

DESCRIPTION OF THE PREFERRED EMBODIMENTS

Figure 2:
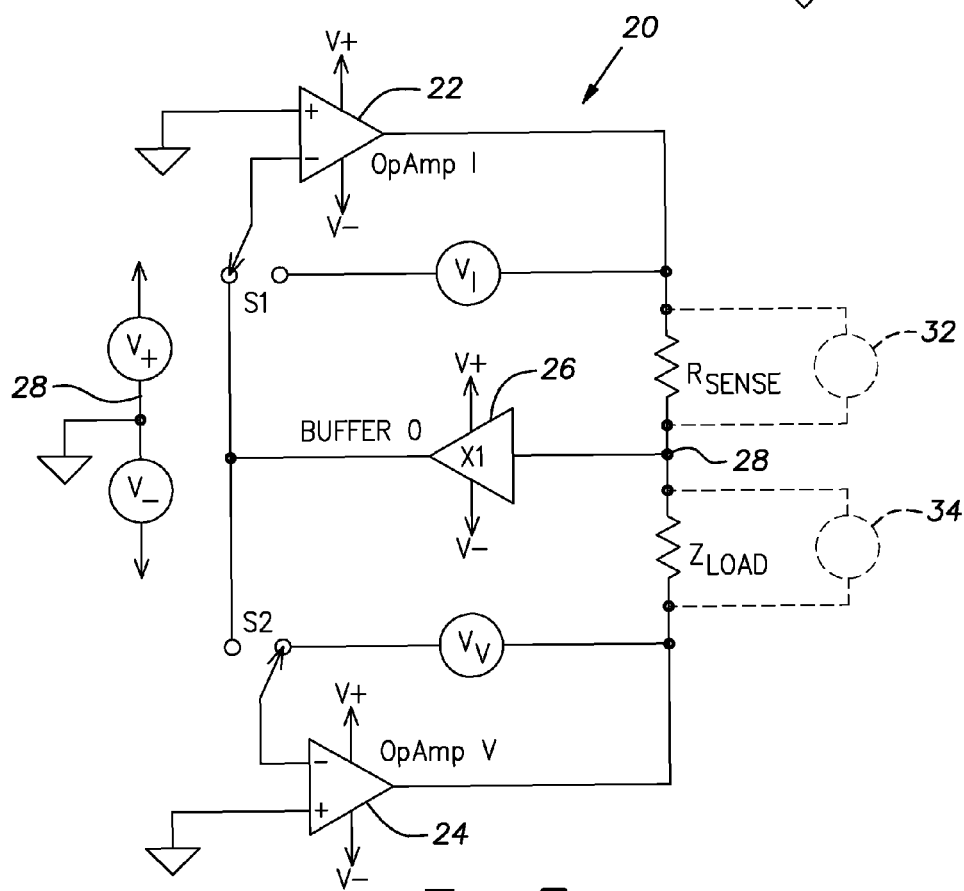
FIG. 2 is a schematic diagram of an example of a SMU circuit according to the invention.

Referring to FIG. 2, a circuit 20 has an amplifier 22, and an amplifier 24 and a buffer 26. Each of the elements 22, 24, 26 are powered by a power supply 28 that is referenced to the circuit ground. When the switches S1, S2 are as shown, the amplifier 22 forces the common point 28 feeding the buffer 26 to a virtual ground, while the amplifier 24 forces $V_v$ across $Z_{Load}$ (the device under test). When the switches S1, S2 are reversed, the amplifier 24 forces the common point 28 to a virtual ground, while the amplifier 22 forces current through $Z_{Load}$ corresponding to $V_I$ across $R_{Sense}$.

Figure 1:
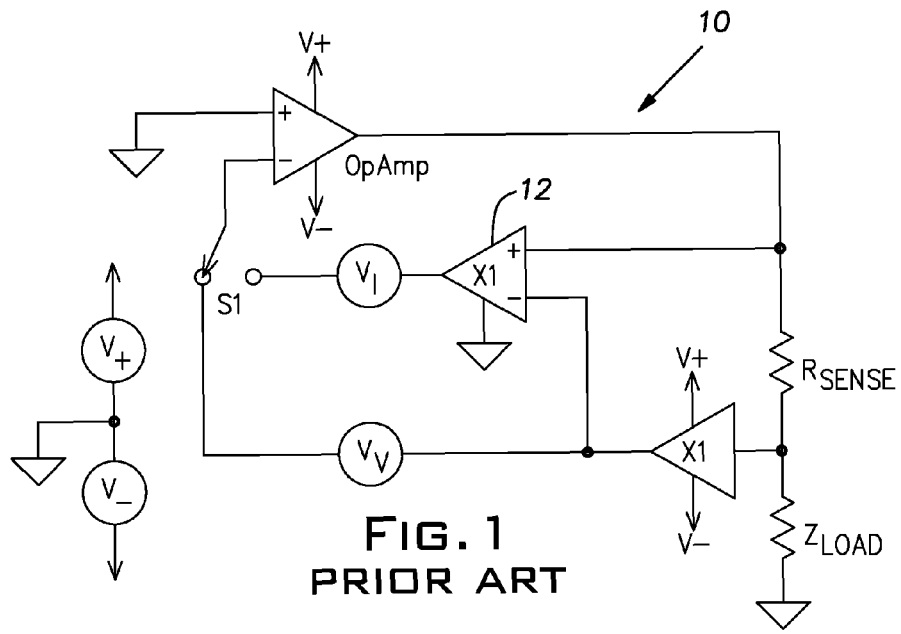
FIG. 1 is a schematic diagram of a prior art SMU circuit.

Because the common point 28 is forced to a virtual ground, there are no voltage offsets such as found in FIG. 1. This results in more accurate measurements (as well as not needing amplifiers with high common mode rejection).

Measuring equipment 32, 34 may be provided to measure the voltage/current signals associated with $Z_{Load}$ and $R_{Sense}$ when a current or voltage is forced on $Z_{Load}$.

In this example, the amplifier 22 and the voltage source $V_I$ can be considered a current output stage and the amplifier 24 and the voltage source $V_V$ can be considered a voltage output stage. There are many ways that the voltage output stage and the current output stage can be implemented.

Figure 3:
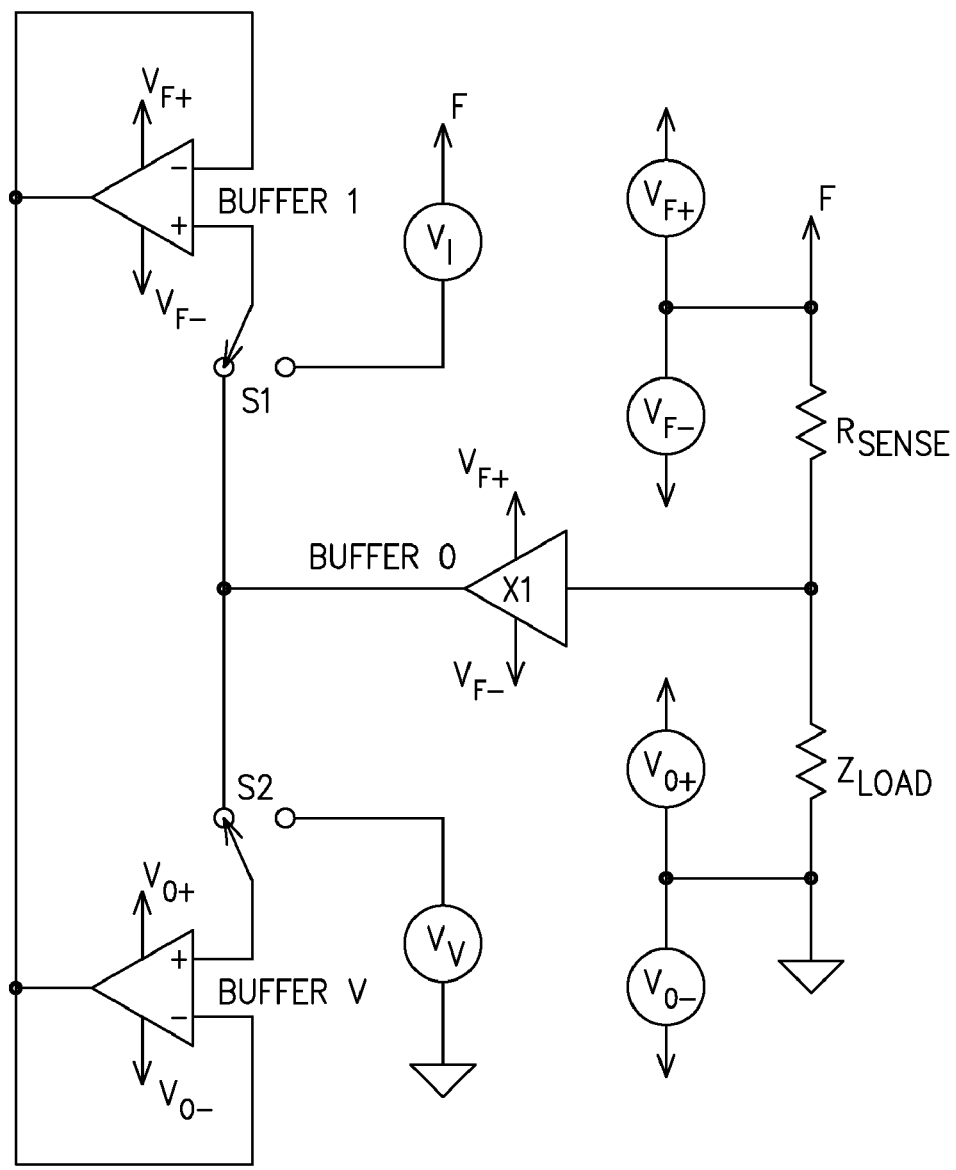
FIG. 3 is a schematic diagram of another example of a SMU circuit according to the invention.
Figure 4:
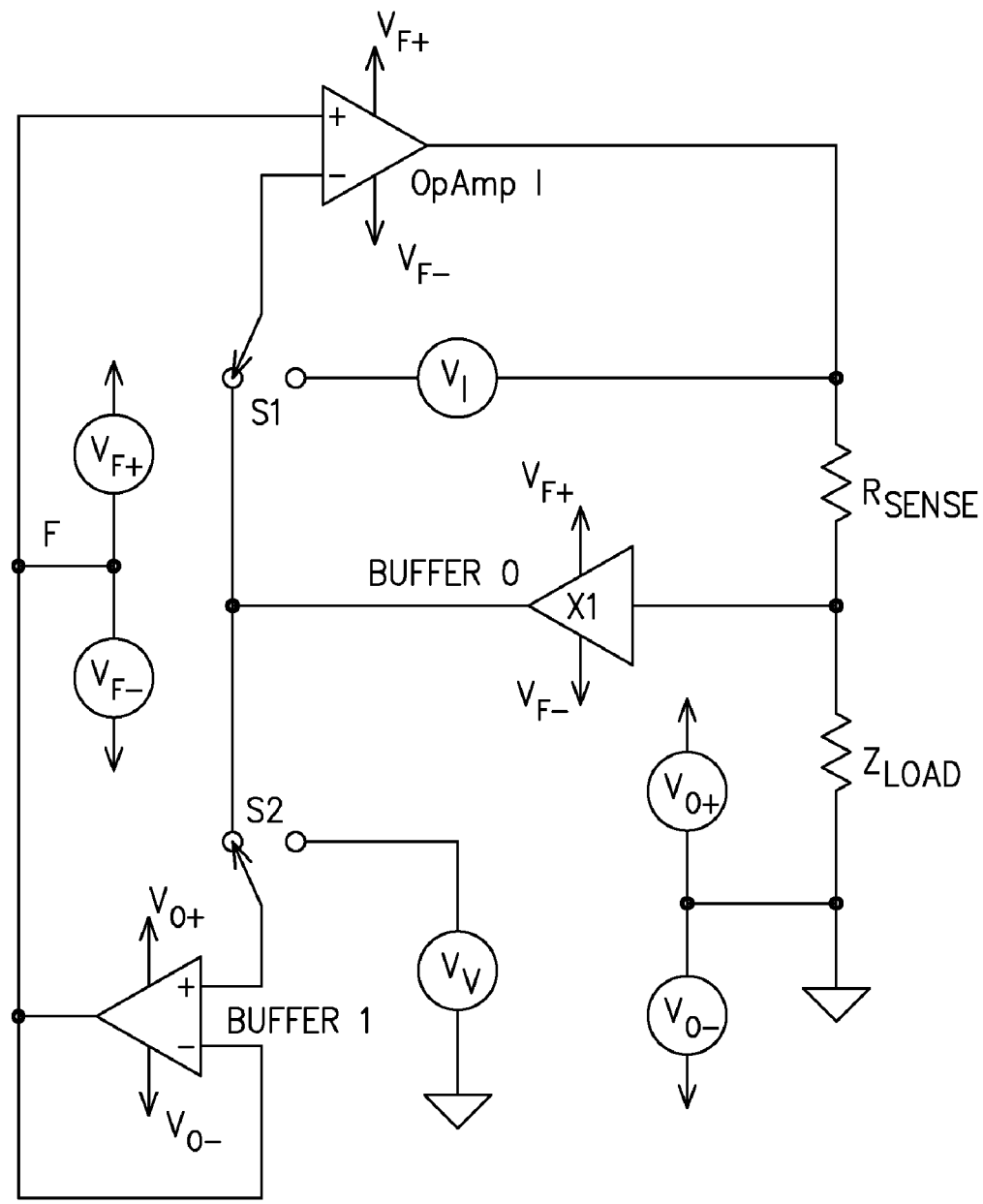
FIG. 4 is a schematic diagram of an additional example of a SMU circuit according to the invention.

Referring to FIGS. 3 and 4, different examples basically vary in which reference points the power supplies of the output stage amplifiers and buffer float on. The basic operation remains the same.

Figure 5:
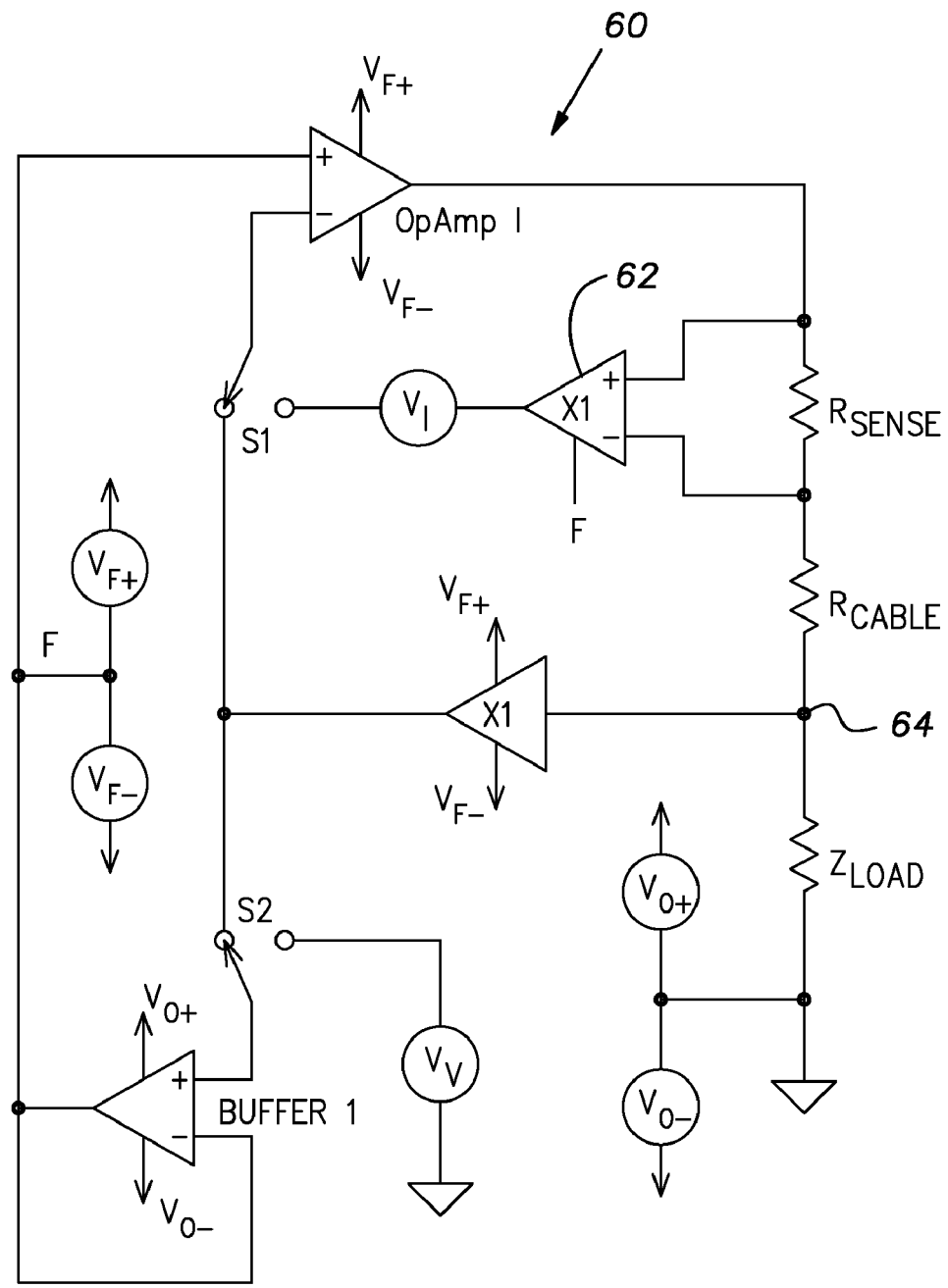
FIG. 5 is a schematic diagram of still another example of a SMU circuit according to the invention.

Referring to FIG. 5, the circuit 60 is a variation of the example of FIG. 4 that is designed to deal with the often real issue of cabling resistance $R_{Cable}$ between $Z_{Load}$ and $R_{Sense}$. A common mode rejecting amplifier 62 is added to feed back just the $R_{Sense}$ voltage. Issues with translating from the offset voltage are minimized because the common point 64 will still be at a virtual ground and the voltage drop across $R_{Cable}$ will typically be relatively small.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A circuit for alternatively controlling a current through a device and permitting measurement of a voltage across the device or controlling a voltage across the device and permitting measurement of a current through the device, said circuit comprising:
   a sense impedance in series combination with said device;
   a buffer communicating with a common point between said sense impedance and said device;
   a current output stage; and
   a voltage output stage, wherein when said circuit is controlling said current through said device, said voltage output stage forces said common point to a virtual ground and said current output stage forces a desired current through said device in response to a signal from said buffer and when said circuit is controlling said voltage across said device, said current output stage forces said common point to a virtual ground and said voltage output stage forces a desired voltage across said device in response to the signal from said buffer.

2. A circuit according to claim 1, further comprising signal measuring equipment for measuring said current through said device or said voltage across said device.

* * * * *